(12) United States Patent
Shigematsu et al.

(10) Patent No.: US 12,106,880 B2
(45) Date of Patent: Oct. 1, 2024

(54) CIRCUIT ELEMENT

(71) Applicant: Murata Manufacturing Co., Ltd., Nagaokakyo (JP)

(72) Inventors: Satoshi Shigematsu, Nagaokakyo (JP); Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 597 days.

(21) Appl. No.: 17/469,994

(22) Filed: Sep. 9, 2021

(65) Prior Publication Data

US 2021/0407721 A1 Dec. 30, 2021

Related U.S. Application Data

(63) Continuation of application No. PCT/JP2020/021190, filed on May 28, 2020.

(30) Foreign Application Priority Data

Jul. 5, 2019 (JP) ................................. 2019-126215

(51) Int. Cl.
*H01F 27/28* (2006.01)
*H01F 17/00* (2006.01)
(Continued)

(52) U.S. Cl.
CPC ....... *H01F 17/0006* (2013.01); *H01F 27/292* (2013.01); *H01G 4/005* (2013.01);
(Continued)

(58) Field of Classification Search
CPC ............... H01F 17/0006; H01F 27/292; H01F 2027/2809; H01F 17/0013;
(Continued)

(56) References Cited

U.S. PATENT DOCUMENTS

| 8,446,705 | B2 * | 5/2013 | Ritter | ...................... | H01G 4/30 |
| | | | | | 361/321.1 |
| 2013/0009726 | A1 * | 1/2013 | Sasaki | .................. | H03H 7/0115 |
| | | | | | 336/200 |
| 2017/0324396 | A1 * | 11/2017 | Nakama | .................... | H01G 4/40 |

FOREIGN PATENT DOCUMENTS

| JP | 2009076719 A | * | 4/2009 |
| JP | 2012-104547 A | | 5/2012 |
| JP | 2013-021449 A | | 1/2013 |

OTHER PUBLICATIONS

Official Communication issued in International Patent Application No. PCT/JP2020/021190, mailed on Sep. 1, 2020.

* cited by examiner

*Primary Examiner* — Tszfung J Chan
*Assistant Examiner* — Kazi S Hossain
(74) *Attorney, Agent, or Firm* — Keating & Bennett, LLP

(57) ABSTRACT

A circuit element includes a multilayer body, internal elements inside the multilayer body, and first outer electrodes and second outer electrodes on outer surfaces of the multilayer body, and the multilayer body includes laminated base material layers. The internal elements include coil conductors connected to the second outer electrodes, the coil conductors have a winding axis in the laminating direction of the base material layers, the first outer electrodes are in contact with a mounting surface of the multilayer body, the second outer electrodes are in contact with side edges of the multilayer body and separated from the mounting surface, and maximum widths of the second outer electrodes are smaller than maximum widths of the first outer electrodes.

13 Claims, 7 Drawing Sheets

(51) Int. Cl.
    *H01F 27/29*     (2006.01)
    *H01G 4/005*     (2006.01)
    *H01G 4/40*      (2006.01)
    *H03H 7/01*      (2006.01)
    *H03H 1/00*      (2006.01)

(52) U.S. Cl.
    CPC ............ *H01G 4/40* (2013.01); *H03H 7/0115* (2013.01); *H03H 2001/0085* (2013.01)

(58) Field of Classification Search
    CPC .. H01F 2017/0026; H01G 4/005; H01G 4/40; H01G 4/232; H01G 4/30; H03H 7/0115; H03H 2001/0085
    USPC ................................ 336/200, 232, 198, 192
    See application file for complete search history.

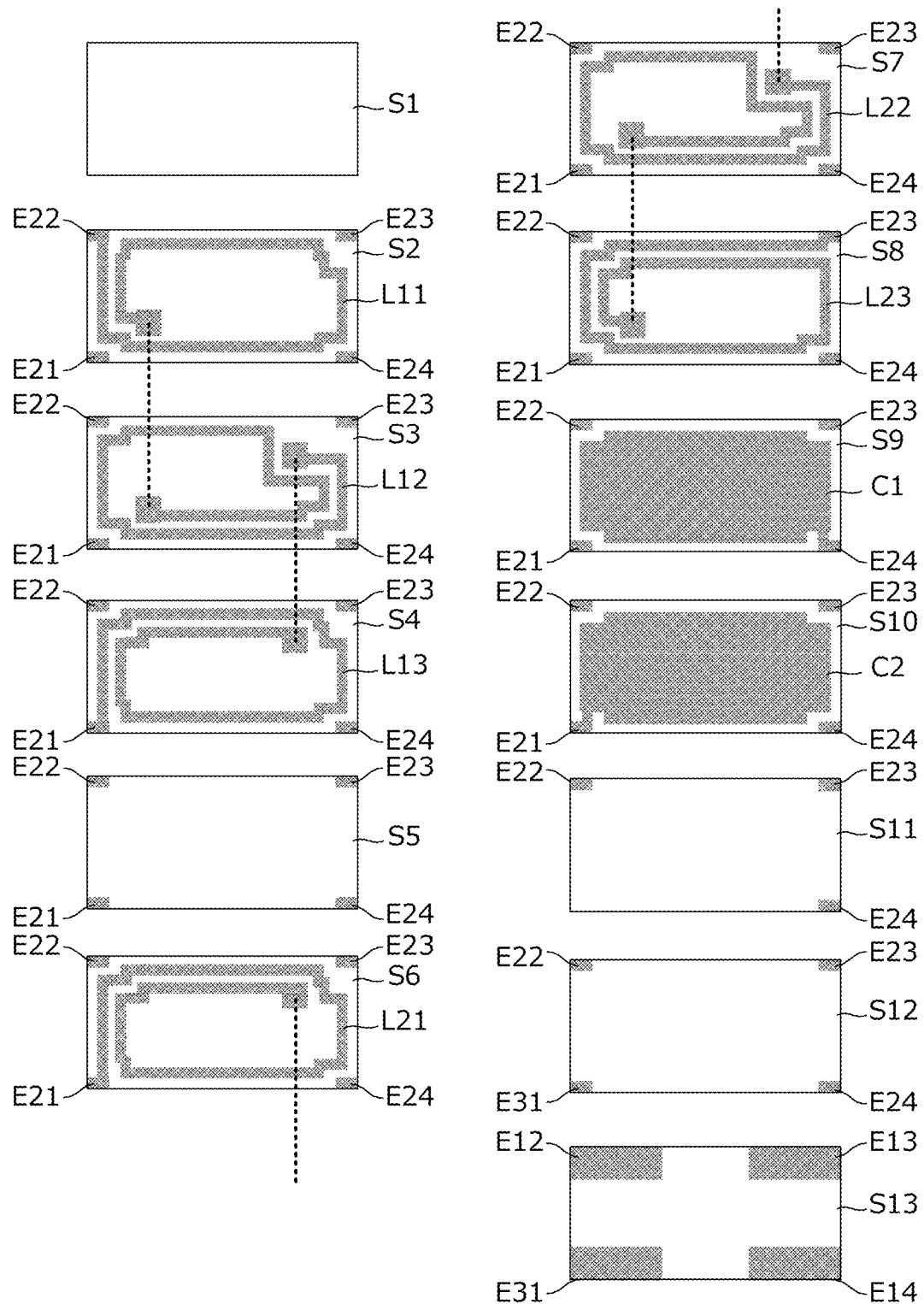

< COMPARATIVE EXAMPLE >

< COMPARATIVE EXAMPLE >

CIRCUIT ELEMENT

CROSS REFERENCE TO RELATED APPLICATIONS

This application claims the benefit of priority to Japanese Patent Application No. 2019-126215 filed on Jul. 5, 2019 and is a Continuation Application of PCT Application No. PCT/JP2020/021190 filed on May 28, 2020. The entire contents of each application are hereby incorporated herein by reference.

BACKGROUND OF THE INVENTION

1. Field of the Invention

The present invention relates to a circuit element that includes a multilayer body including laminated base material layers and a coil conductor inside the multilayer body.

2. Description of the Related Art

Circuit elements, such as a chip inductor and a chip transformer, have included a coil conductor disposed inside a multilayer body including laminated base material layers. Further, circuit elements used, for example, as LC hybrid components have been obtained by further providing a capacitor electrode inside the multilayer body.

For example, Japanese Unexamined Patent Application Publication No. 2013-21449 discloses circuit elements that each include inductors and capacitors provided in a multilayer body including laminated insulating layers and that are used as filters.

If a circuit element, which includes a multilayer body including laminated base material layers, includes a coil conductor that is disposed in predetermined base material layers and that has the winding axis in the laminating direction of the multilayer body, a via-hole conductor disposed in the multilayer body as an electrode that connects internal elements (for example, as an electrode that connects a capacitor electrode and the coil conductor) reduces the size of the coil opening by the amount of area occupied by the via-hole conductor. For example, if a via-hole conductor is provided outside the area where the coil conductor is provided and the shape of the coil conductor is determined so as not to overlap the area occupied by the via-hole conductor, the size of the coil opening is reduced. Similarly, the area of the capacitor electrode is also reduced by the amount of area occupied by the via-hole conductor.

In contrast, if an electrode that connects internal elements is provided on a side surface of the multilayer body, the above problem can be avoided. However, such an outer electrode that connects internal elements may block a magnetic flux generated by the coil conductor. Consequently, the Q value of an inductor may decrease, or a coefficient of coupling between coils may decrease.

SUMMARY OF THE INVENTION

Preferred embodiments of the present invention provide circuit elements that each enable efficient use of an internal volume of a multilayer body including laminated base material layers and that each prevent an outer electrode that connects internal elements from blocking a magnetic flux generated by a coil conductor.

According to a preferred embodiment of the present invention, a circuit element includes a multilayer body having a rectangular or substantially rectangular parallelepiped shape and including laminated base material layers, at least one internal element inside the multilayer body, and a first outer electrode and a second outer electrode on outer surfaces of the multilayer body, wherein the at least one internal element includes a coil conductor connected to the second outer electrode, the coil conductor includes a winding axis extending in a laminating direction of the base material layers, the first outer electrode is in contact with a mounting surface, the mounting surface being a bottom surface of the multilayer body in the laminating direction, the second outer electrode is in contact with a side edge and separated from the mounting surface, the side edge being where first and second surfaces of four side surfaces of the multilayer body intersect, and a maximum width of the second outer electrode is smaller than a maximum width of the first outer electrode in a direction parallel or substantially parallel to the mounting surface.

Since the second outer electrode, which is connected to the at least one internal element, is in contact with a side edge of the multilayer body according to preferred embodiments of the present invention, the circuit element enables efficient use of the internal volume of the multilayer body including laminated base material layers and prevents the second outer electrode from blocking a magnetic flux generated by the coil conductor.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is an exploded plan view of an insulating-base-material pattern and a conductor pattern provided in or on each base material layer of the circuit element 101.

DETAILED DESCRIPTION OF THE PREFERRED EMBODIMENTS

Figure 1:
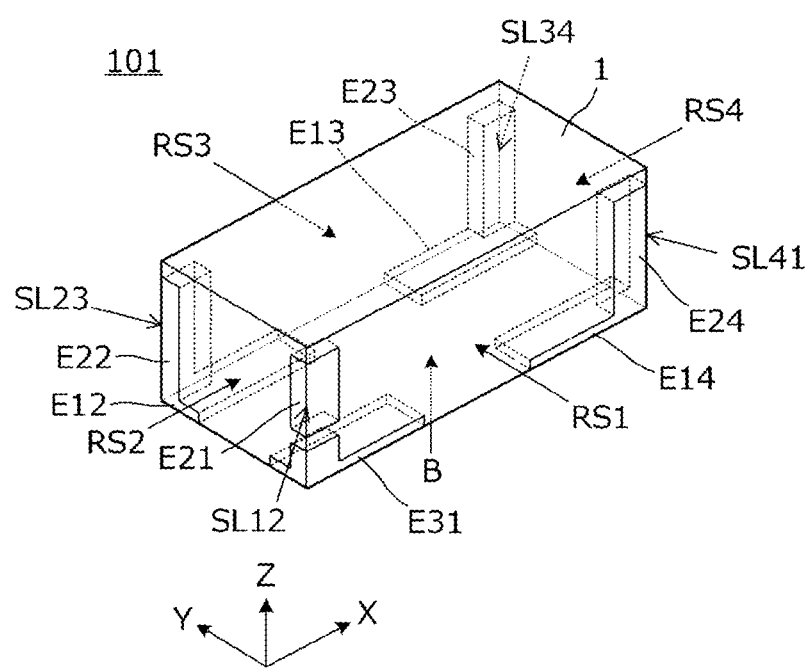
FIG. 1 is a perspective view of a circuit element 101 according to a first preferred embodiment of the present invention.

Specific examples will be described with reference to the drawings, and multiple preferred embodiments of the present invention will be presented. In each figure, the same or corresponding portion is denoted by the same reference numeral or symbol. Although multiple preferred embodiments will be described separately as appropriate in consideration of ease of describing or understanding main features, partial substitutions and combinations of configurations illustrated in different preferred embodiments are possible. In a second preferred embodiment and later, features common to a first preferred embodiment will not be described and only different features will be described. In particular, the same or similar operations and the same or similar advantages achieved by the same or similar configurations will not be individually described in each of the preferred embodiments.

First Preferred Embodiment

FIG. 1 is a perspective view of a circuit element 101 according to a first preferred embodiment of the present invention. The circuit element 101 includes a multilayer body 1 having a rectangular or substantially rectangular parallelepiped shape, internal elements disposed inside the multilayer body 1, first outer electrodes E12, E13, and E14, second outer electrodes E21, E22, E23, and E24, and a third outer electrode E31. The multilayer body 1 includes laminated base material layers. The first outer electrodes E12, E13, and E14, the second outer electrodes E21, E22, E23, and E24, and the third outer electrode E31 are disposed on outer surfaces of the multilayer body 1. The internal elements include coil conductors connected to the first outer electrodes E12, E13, and E14 and to the second outer electrodes E21, E22, E23, and E24. The coil conductors have the winding axis extending in the laminating direction of base material layers (parallel or substantially parallel to the Z-axis in FIG. 1) as described below. In FIG. 1, a coordinate system is represented by the X, Y, and Z axes, each of which is parallel or substantially parallel to one edge of the multilayer body 1.

The first outer electrodes E12, E13, and E14 are in contact with a mounting surface B that is the bottom surface of the multilayer body 1 in the laminating direction. The second outer electrodes E21, E22, E23, and E24 are on side edges SL12, SL23, SL34, and SL41 and separated from the mounting surface B. Two adjacent side surfaces of the four side surfaces RS1, RS2, RS3, and RS4 of the multilayer body 1 intersect at one of the four side edges SL12, SL23, SL34, and SL41.

The maximum widths of the second outer electrodes E22, E23, and E24 are smaller than the maximum widths of the first outer electrodes E12, E13, and E14 in the direction parallel or substantially parallel to the mounting surface B. Further, the maximum width of the second outer electrode E21 is smaller than the maximum width of the third outer electrode E31.

FIG. 2 is an exploded plan view of an insulating-base-material pattern and a conductor pattern provided in or on each base material layer of the circuit element 101. A base material layer S1 is located highest, and a base material layer S13 is located lowest. Base material layers S2 to S12 are located between the base material layer S1, which is located highest, and the base material layer S13, which is located lowest. The first outer electrodes E12, E13, and E14 and the third outer electrode E31 are provided on the lower surface of the base material layer S13. The base material layers S2 to S10 include the second outer electrodes E21, E22, E23, and E24. The base material layer S11 includes the second outer electrodes E22, E23, and E24. The base material layer S12 includes the second outer electrodes E22, E23, and E24 and the third outer electrode E31. The second outer electrodes E21, E22, E23, and E24 penetrate through the base material layers S2 to S12. In other words, the second outer electrodes E21, E22, E23, and E24 are continuously provided through multiple base material layers in the laminating direction of the base material layers. In this way, the second outer electrodes E21, E22, E23, and E24 each include portions of an outer electrode denoted by the same reference symbol in base material layers, and these portions are electrically connected to each other. Portions of the second outer electrodes E22, E23, and E24, which are included in the base material layer S12, are electrically connected to the first outer electrodes E12, E13, and E14, respectively, which are included in the base material layer S13. Further, a portion of the third outer electrode E31 included in the base material layer S12 is electrically connected to a portion of the third outer electrode E31 included in the base material layer S13.

The base material layers S2, S3, and S4 include first coil conductors L11, L12, and L13, respectively. The base material layers S6, S7, and S8 include second coil conductors L21, L22, and L23, respectively. Dashed lines in FIG. 2 indicate positions at which coil conductors are connected by via-hole conductors.

A first end of the first coil conductor L11 is connected to the second outer electrode E22. The base material layer S3 includes a via-hole conductor connecting a second end of the first coil conductor L11 and a first end of the first coil conductor L12. Further, the base material layer S4 includes a via-hole conductor connecting a second end of the first coil conductor L12 and a first end of the first coil conductor L13. A second end of the first coil conductor L13 is connected to the second outer electrode E21. The first coil conductors L11, L12, and L13 and the via-hole conductors define a first coil L1, which will be described below.

A first end of the second coil conductor L21 is connected to the second outer electrode E21. The base material layer S7 includes a via-hole conductor connecting a second end of the second coil conductor L21 and a first end of the second coil conductor L22. Further, the base material layer S8 includes a via-hole conductor connecting a second end of the second coil conductor L22 and a first end of the second coil conductor L23. A second end of the second coil conductor L23 is connected to the second outer electrode E23. The second coil conductors L21, L22, and L23 and the via-hole conductors define a second coil L2, which will be described below.

The base material layers S9 and S10 include capacitor electrodes C1 and C2, respectively. The capacitor electrodes C1 and C2 define a capacitor C, which will be described below.

The base material layers S1 to S13 of the multilayer body 1 are formed by, for example, screen printing, exposure, and development by using photosensitive insulating paste and photosensitive conductive paste, and the multilayer body 1 is formed by, for example, laminating these base material layers.

Specifically, a photosensitive insulating paste layer is formed by, for example, screen printing, irradiated with ultraviolet light, and developed by using an alkaline solution. An insulating-base-material pattern including openings for outer electrodes, via holes, and other openings is formed in this process. Further, a photosensitive conductive paste layer is formed by, for example, screen printing, irradiated with ultraviolet light, and developed by using an alkaline solution. A conductor pattern is formed in this process. These insulating-base-material patterns and conductor patterns are laminated, and a mother multilayer body is obtained. Then, the mother multilayer body is divided into individual pieces, and a number of multilayer bodies 1 are obtained. The surface of each outer electrode is plated, for example, with Ni/Au to improve solderability, conductivity, and environmental durability.

A method for forming the multilayer body 1 is not limited to the above-described example method. For example, conductive paste may be applied by using a screen plate including openings that match the shape of a conductor pattern, and obtained patterns may be laminated. Conducting foil may be pasted to an insulating base material and patterned to form a conductor pattern for each base material layer. A method for forming outer electrodes is not limited to the above example method. For example, conductive paste may be applied to multilayer body using dipping or sputtering to form outer electrodes on the bottom surface and the side surfaces of the multilayer body 1. The surfaces obtained in this way may further be plated.

Figure 3A:
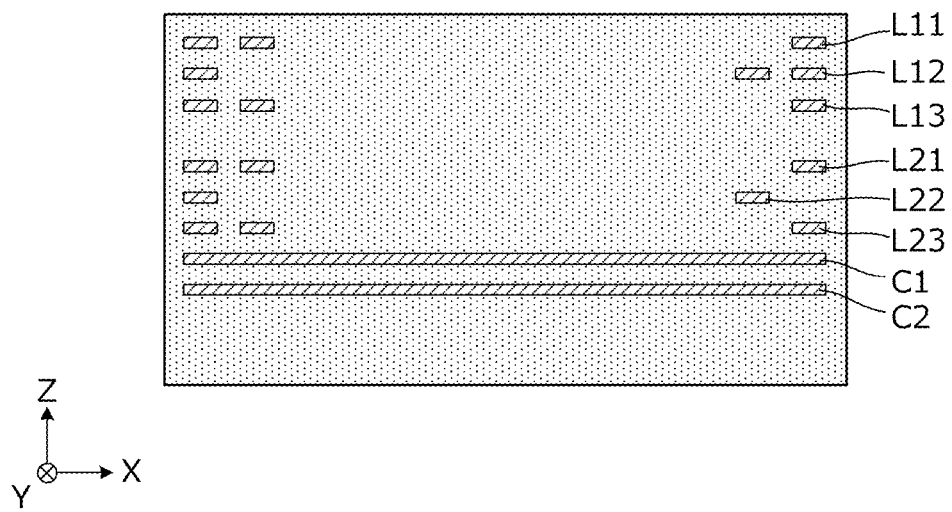
FIG. 3A is a cross-sectional view taken along a plane that is parallel or substantially parallel to the X-Z plane and that passes through the center of the circuit element 101.
Figure 3B:
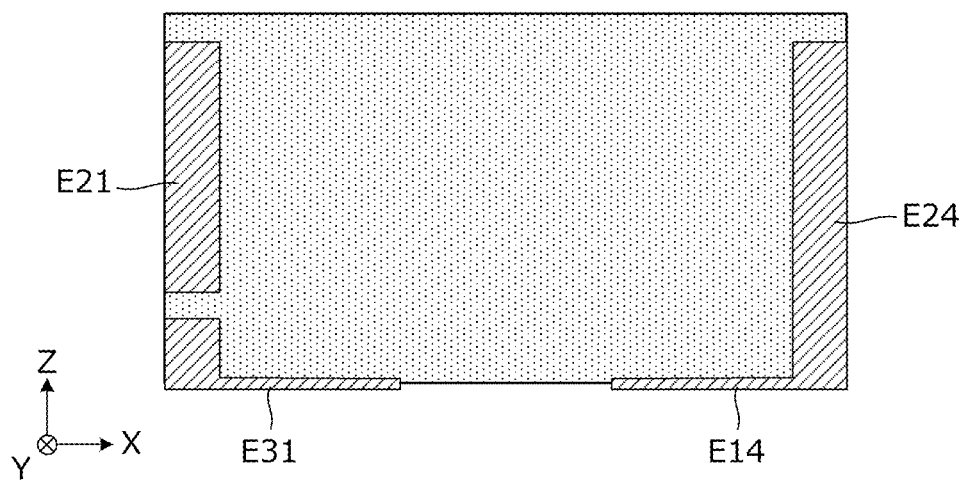
FIG. 3B is a cross-sectional view taken along a plane that is parallel or substantially parallel to the X-Z plane and that passes through a third outer electrode E31 and a first outer electrode E14 of the circuit element 101.

FIG. 3A is a cross-sectional view taken along a plane that is parallel or substantially parallel to the X-Z plane and that passes through the center of the circuit element 101. FIG. 3B is a cross-sectional view taken along a plane that is parallel or substantially parallel to the X-Z plane and that passes through the third outer electrode E31 and the first outer electrode E14 of the circuit element 101.

The first coil L1 and the second coil L2 are magnetically coupled because the coil openings of the first coil conductors L11, L12, and L13 lie on top of the coil openings of the second coil conductors L21, L22, and L23 in the direction parallel or substantially parallel to the Z-axis (the winding axes match each other).

Figure 4:
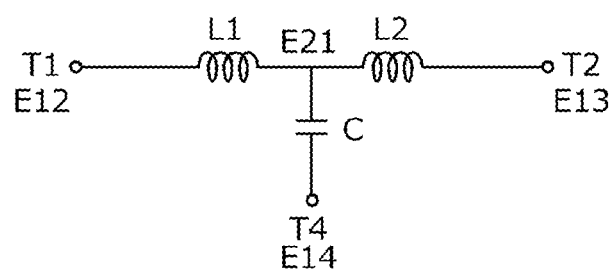
FIG. 4 is a circuit diagram of the circuit element 101.

FIG. 4 is a circuit diagram of the circuit element 101. The circuit element 101 includes the first coil L1, which is defined by the first coil conductors L11, L12, and L13, the second coil L2, which is defined by the second coil conductors L21, L22, and L23, and the capacitor C, which is defined by the capacitor electrodes C1 and C2. A terminal T1 corresponds to the first outer electrode E12, and a terminal T2 corresponds to the first outer electrode E13. A terminal T4 corresponds to the first outer electrode E14. An unbalanced signal is input to or output from the terminal T1 or T2 with the terminal T4 connected to the ground potential, and this circuit operates as a filter circuit. In short, inductors of the first coil L1 and the second coil L2 and the capacitor C define an LC filter circuit.

Figure 5:
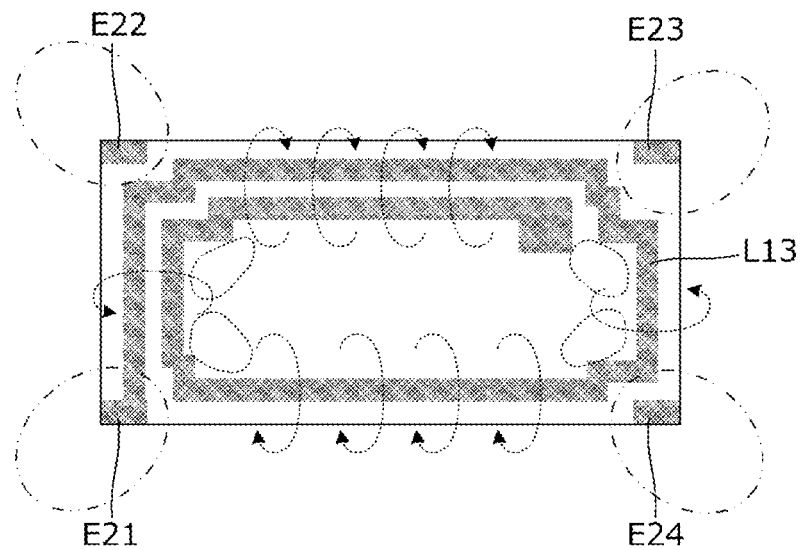
FIG. 5 shows interference between a coil conductor and second outer electrodes in the circuit element 101.
Figure 10:
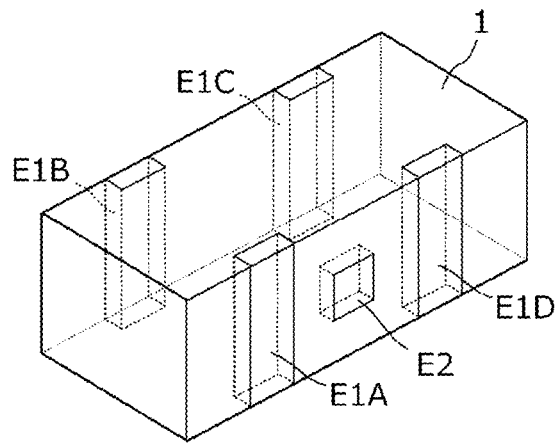
FIG. 10 is a perspective view of a circuit element as a comparative example.

FIG. 5 shows interference between a coil conductor and second outer electrodes in the circuit element 101 according to the present preferred embodiment. FIG. 10 is a perspective view of a circuit element as a comparative example, and FIG. 11 shows interference between a coil conductor and outer electrodes in the circuit element as a comparative example.

Figure 11:
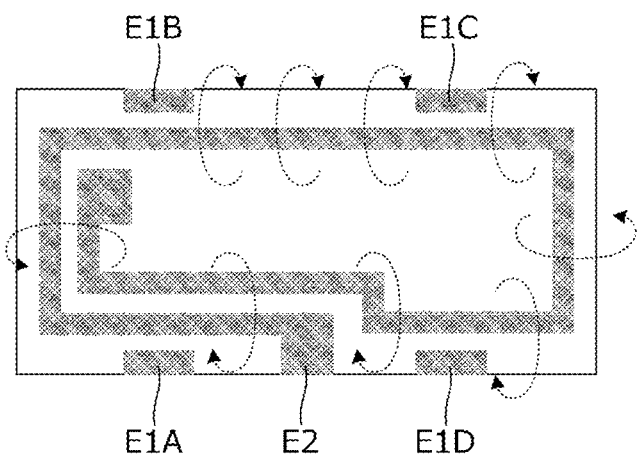
FIG. 11 depicts interference between a coil conductor and outer electrodes in the circuit element as a comparative example.

The circuit element as a comparative example, which is shown in FIGS. 10 and 11, includes outer electrodes E1A, E1B, E1C, and E1D and an outer electrode E2 on two opposite side surfaces. The outer electrode E2 is connected to an internal element inside a multilayer body 1. As shown in this example, if outer electrodes are provided on two opposite side surfaces of a multilayer body 1 having a rectangular or substantially rectangular parallelepiped shape, a coil conductor pattern is disposed so as not to overlap these outer electrodes, and the size of a loop defined by the coil conductor pattern cannot be increased because of this requirement. In addition, the areas of the capacitor electrodes cannot be increased either because of this requirement.

In contrast, in the present preferred embodiment, as shown in FIG. 5, the second outer electrodes E21, E22, E23, and E24 are unlikely to restrict a loop defined by the coil conductor. This configuration allows loops provided by the coil conductors L11, L12, L13, L21, L22, and L23 to be large.

In FIGS. 5 and 11, a dashed line with an arrowhead schematically represents a magnetic flux generated by a coil conductor. In the circuit element as a comparative example, as shown in FIG. 11, the outer electrodes E1A, E1B, E1C, and E1D and the outer electrode E2 block a route generated by the magnetic flux. Consequently, coefficients of coupling between coils decrease, and Q values of coils are degraded.

Regions surrounded by dashed lines inside the coil opening shown in FIG. 5 are located inside the corners of the loop defined by the coil conductor, and the magnetic flux density is high in these regions. In contrast, regions surrounded by two-dot chain lines outside the coil opening are located outside the corners of the loop defined by the coil conductor, and the magnetic flux density is low in these regions. Since the second outer electrodes E21, E22, E23, and E24 are located in the regions where the magnetic flux density is low in the circuit element 101 according to the present preferred embodiment, the second outer electrodes E21, E22, E23, and E24 are very unlikely to block the magnetic flux generated by the coil conductor. Consequently, decreases in coefficients of coupling between coils and degradation of Q values of coils are avoided.

Figure 6:
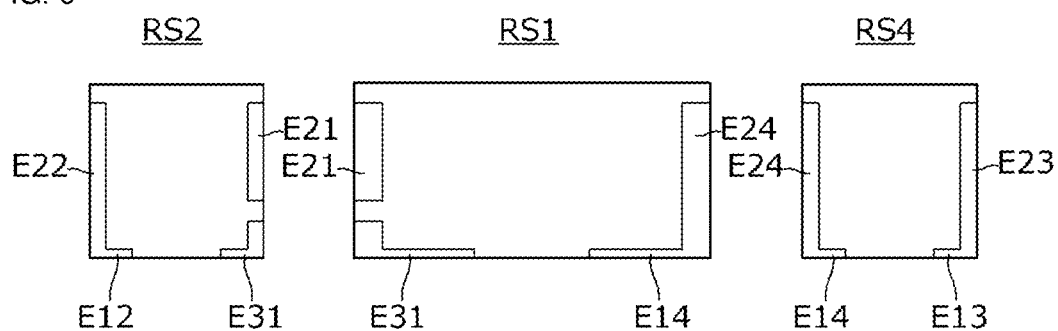
FIG. 6 shows widths of outer electrodes on three side surfaces of the circuit element 101.

FIG. 6 shows widths of outer electrodes on three side surfaces of the circuit element 101. As is evident from FIGS. 1 and 6, a first side surface RS1 represents a side surface having a larger area, and a second side surface RS2 represents a side surface having a smaller area in this example. The widths of the second outer electrodes E21 and E24 on the first side surface RS1 (widths in a direction parallel or substantially parallel to the mounting surface B) are larger than the widths on the second side surface RS2 (widths in a direction parallel or substantially parallel to the mounting surface B). A similar relationship between the widths of the second outer electrodes E22 and E23 exists. The width of the third outer electrode E31 on the first side surface RS1 is also larger than the width on the second side surface RS2.

Since the longitudinal direction of the multilayer body 1 having a rectangular or substantially rectangular parallelepiped shape matches the longitudinal directions of the second outer electrodes E21, E22, E23, and E24 in this way, the occupancy ratio of a second outer electrode to a side surface is the same or substantially the same for all the side surfaces of the multilayer body 1. Accordingly, coil conductor patterns are easily designed not to overlap the second outer electrodes E21, E22, E23, and E24, and the internal volume of the multilayer body 1 can efficiently be used.

As described above, the second outer electrodes E21, E22, E23, and E24 are connected to the internal elements, i.e., the coil conductors L11, L12, L13, L21, L22, and L23 and the capacitor electrodes C1 and C2, and the second outer electrodes E21, E22, E23, and E24 are disposed in contact with the side edges SL12, SL23, SL34, and SL41 of the multilayer body 1 according to the present preferred embodiment. Thus, the internal volume of the multilayer body 1 can be efficiently used. In addition, since the second outer electrodes E21, E22, E23, and E24 are located at positions where magnetic fluxes generated by the coil conductors L11, L12, L13, L21, L22, and L23 are unlikely to be blocked, a decrease in the coefficient of coupling between the first coil L1 and the second coil L2 and degradation of the Q values of the coils are avoided.

Further, since the first outer electrodes E12, E13, and E14 and the third outer electrode E31 are in contact with the mounting surface B of the multilayer body 1 and in contact with the side edges SL12, SL23, SL34, and SL41 according to the present preferred embodiment, the internal volume of the multilayer body 1 can be efficiently used. In addition, since the first outer electrodes E12, E13, and E14 and the third outer electrode E31 are located at positions where magnetic fluxes generated by the coil conductors L11, L12, L13, L21, L22, and L23 are unlikely to be blocked, a decrease in the coefficient of coupling between the first coil L1 and the second coil L2 and degradation of the Q values of the coils are avoided.

Further, since the first outer electrodes E12, E13, and E14 and the third outer electrode E31 are disposed in the corners of the mounting surface B of the multilayer body 1 having a rectangular or substantially rectangular parallelepiped shape according to the present preferred embodiment, a tombstone phenomenon, in which one side of the circuit element 101 is lifted during surface mounting of the circuit element 101 on a circuit board, is unlikely to occur.

Further, the widths of the second outer electrodes E22, E23, and E24 are smaller than the widths of the first outer electrodes E12, E13, and E14 in a direction parallel or substantially parallel to the mounting surface B according to the present preferred embodiment. Similarly, the width of the second outer electrode E21 is smaller than the width of the third outer electrode E31. Since these structures reduce the area occupied by outer electrodes in regions where the magnetic flux density is high, the magnetic flux is unlikely to be blocked by the outer electrodes, and these structures reduce or prevent the magnetic flux generated by the coil conductors from being blocked. The maximum widths of the second outer electrodes E22, E23, and E24 are required to be smaller than the maximum widths of the first outer electrodes E12, E13, and E14 to provide such an advantageous effect. Similarly, the maximum width of the second outer electrode E21 is required to be smaller than the maximum width of the third outer electrode E31.

Further, as is evident from FIG. 6, the first outer electrode E12 and the second outer electrode E22 define an L shape on the side surface RS2 of the multilayer body 1 with the lower portion of the L shape in contact with the mounting surface B and the side portion of the L shape in contact with a side edge (SL23 depicted in FIG. 1) of the multilayer body 1. The first outer electrode E12, which defines the lower portion of the L shape, is shorter in the laminating direction than the second outer electrode E22, which defines the side portion of the L shape. This structure allows solder to wet the first outer electrodes E12, E13, and E14 and the third outer electrode E31 on the side surfaces after a reflow soldering process is repeated multiple times. "Solder fillets" are provided only on the wetted portions. That is, the portions wetted by solder are restricted. Consequently, high mounting strength is obtained when the circuit element 101 is mounted on a circuit board. In addition, although outer electrodes occupy a long region in the laminating direction, solder hardly wets the second outer electrodes E21, E22, E23, and E24, and thus a tombstone phenomenon, in which one side of the circuit element 101 is lifted, can be avoided. A solder bridge between the second outer electrode E21 and the third outer electrode E31 can also be avoided.

Second Preferred Embodiment

In a second preferred embodiment of the present invention, a description will be provided of an example of a circuit element including first outer electrodes and second outer electrodes having structures that differ from the structures of the first outer electrodes and the second outer electrodes included in the circuit element 101 described in the first preferred embodiment.

Figure 7:
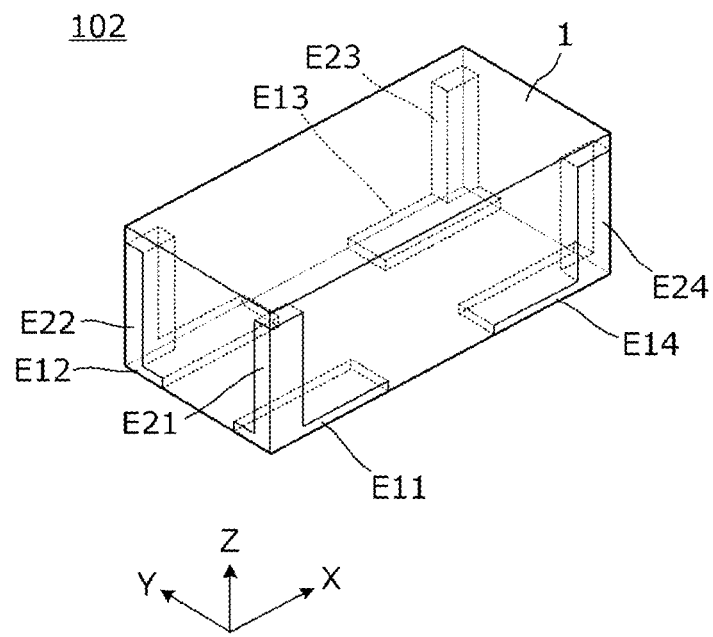
FIG. 7 is a perspective view of a circuit element 102 according to a second preferred embodiment of the present invention.

FIG. 7 is a perspective view of a circuit element 102 according to the second preferred embodiment. The circuit element 102 includes a multilayer body 1 having a rectangular or substantially rectangular parallelepiped shape, internal elements disposed inside the multilayer body 1, first outer electrodes E11, E12, E13, and E14, and second outer electrodes E21, E22, E23, and E24. The multilayer body 1 includes laminated base material layers. The first outer electrodes E11, E12, E13, and E14 and the second outer electrodes E21, E22, E23, and E24 are disposed on outer surfaces of the multilayer body 1. The circuit element 102 differs from the circuit element 101 shown in FIG. 1 in that the circuit element 102 includes the first outer electrode E11 and that the first outer electrode E11 is electrically connected to the second outer electrode E21.

Figure 8:
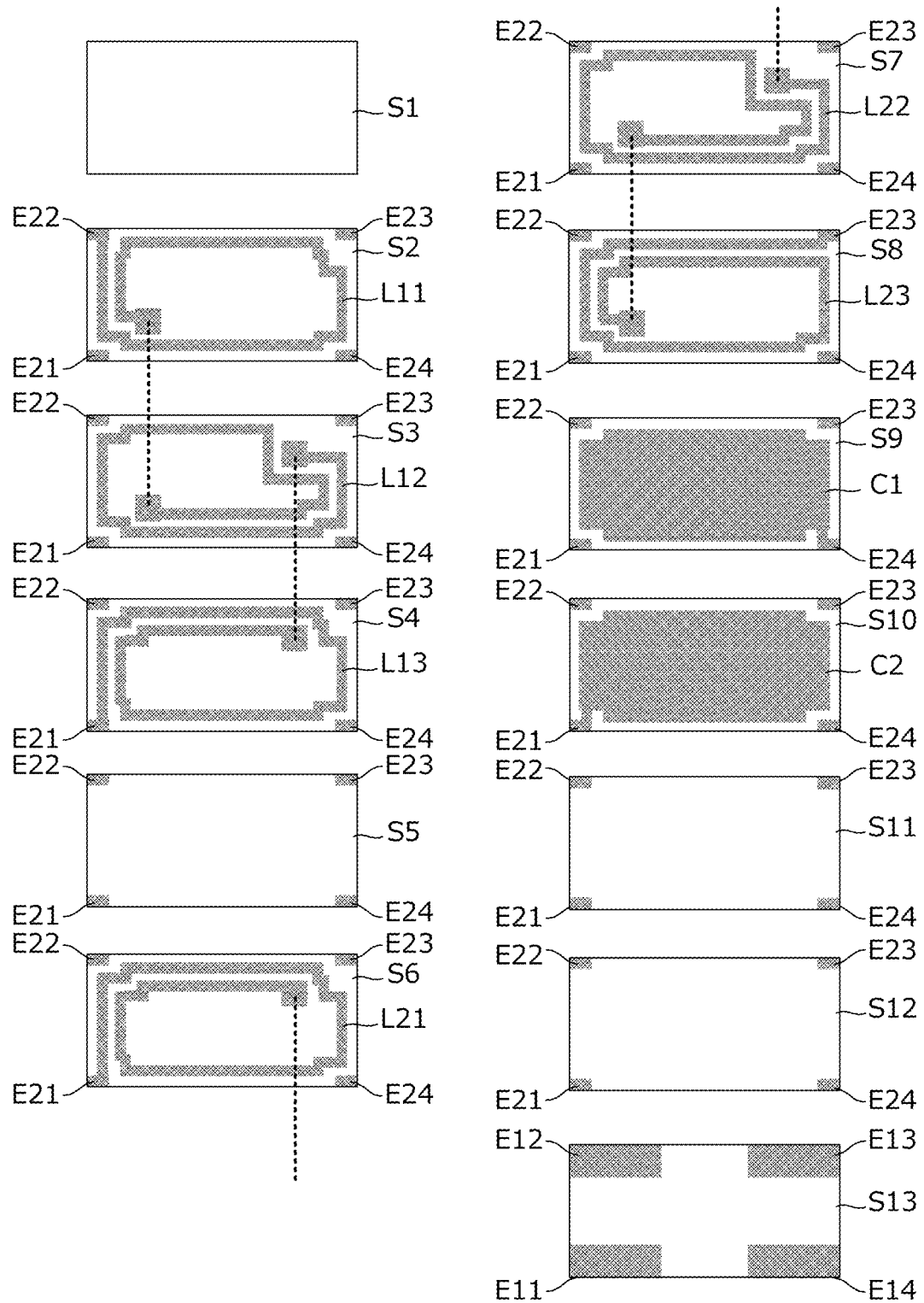
FIG. 8 is an exploded plan view of a conductor pattern in or on each base material layer of the circuit element 102.

FIG. 8 is an exploded plan view showing a conductor pattern provided in or on each base material layer of the circuit element 102. A base material layer S1 is located highest, and a base material layer S13 is located lowest. Base material layers S2 to S12 are located between the base material layer S1, which is located highest, and the base material layer S13, which is located lowest. The first outer electrodes E11, E12, E13, and E14 are provided on the lower surface of the base material layer S13. The base material layers S2 to S12 include the second outer electrodes E21, E22, E23, and E24. The second outer electrodes E21, E22, E23, and E24 each include portions of an outer electrode denoted by the same reference symbol in base material layers, and these portions are electrically connected to each other. Portions of the second outer electrodes E21, E22, E23, and E24, which are included in the base material layer S12, are electrically connected to the first outer electrodes E11, E12, E13, and E14, respectively, which are included in the base material layer S13. Other structures are the same or substantially the same as the structures described in the first preferred embodiment.

Figure 9:
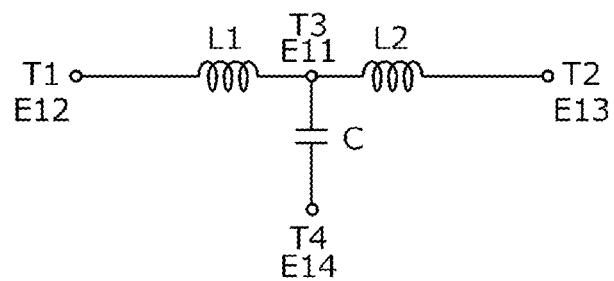
FIG. 9 is a circuit diagram of the circuit element 102.

FIG. 9 is a circuit diagram of the circuit element 102. The circuit element 102 includes a first coil L1, a second coil L2, and a capacitor C. A terminal T1 corresponds to the first outer electrode E12, and a terminal T2 corresponds to the first outer electrode E13. A terminal T3 corresponds to the first outer electrode E11. A terminal T4 corresponds to the first outer electrode E14. An unbalanced signal is input to or output from the terminal T1 or T2 with the terminal T4 connected to the ground potential, and this circuit operates as an LC filter circuit.

In the example shown in FIG. 1, the third outer electrode E31 is provided only for mounting purposes and is not connected to either the first outer electrodes or the second outer electrodes, but all of the second outer electrodes may each be connected to respective first outer electrodes as described in the second preferred embodiment.

Since the second outer electrodes E21, E22, E23, and E24, which are connected to the internal elements-coil conductors L11, L12, L13, L21, L22, and L23 and capacitor electrodes C1 and C2, are each in contact with a side edge of the multilayer body 1 according to the present preferred embodiment, the internal volume of the multilayer body 1 can be efficiently used. In addition, since the second outer electrodes E21, E22, E23, and E24 are located at positions where magnetic fluxes generated by the coil conductors L11, L12, L13, L21, L22, and L23 are unlikely to be blocked, a decrease in the coefficient of coupling between the first coil L1 and the second coil L2 and degradation of the Q values of the coils are avoided.

Further, since the first outer electrodes E11, E12, E13, and E14 are in contact with a mounting surface B of the multilayer body 1 and are each in contact with a side edge according to the present preferred embodiment, the internal volume of the multilayer body 1 can be efficiently used. In addition, since the first outer electrodes E11, E12, E13, and E14 are located at positions where magnetic fluxes generated by the coil conductors L11, L12, L13, L21, L22, and L23 are unlikely to be blocked, a decrease in the coefficient of coupling between the first coil L1 and the second coil L2 and degradation of the Q values of the coils are avoided.

Finally, the above descriptions of the preferred embodiments of the present invention are illustrative in every respect and are not meant to be limiting. Modifications and variations can be provided as appropriate by those skilled in the art. The scope of the present invention is defined not by the preferred embodiments described above, but by the claims. Further, the scope of the present invention includes modifications to the preferred embodiments within the scope of the claims and equivalents.

For example, the outline of an outer electrode is not limited to line segments parallel or substantially parallel to the X, Y, or Z-axis in a rectangular coordinate system shown in FIGS. 1 and 7. For example, the outline may include a portion inclined with respect to one of the three axes. A round portion or a curve may be included. A variety of shapes can be adopted as the outline of an outer electrode.

Not all four corners of the multilayer body 1 having a rectangular or substantially rectangular parallelepiped shape need to be occupied by a second outer electrode, and the second outer electrodes may be disposed as required.

Although the first outer electrodes are disposed in contact with the mounting surface and the side edges in the examples described above, the first outer electrodes may not be disposed in contact with the side edges. Since the first outer electrodes are also disposed in contact with the mounting surface in such a case, a patterning region for internal elements in the multilayer body is not subject to restrictions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit element comprising:
   a multilayer body having a rectangular or substantially rectangular parallelepiped shape and including laminated base material layers;
   at least one internal element inside the multilayer body; and
   a first outer electrode and a second outer electrode on outer surfaces of the multilayer body; wherein
   the at least one internal element includes a coil conductor connected to the second outer electrode;
   the coil conductor includes a winding axis extending in a laminating direction of the base material layers;
   the first outer electrode is in contact with a mounting surface, the mounting surface being a bottom surface of the multilayer body in the laminating direction;
   the second outer electrode is in contact with a side edge and separated from the mounting surface, the side edge being where two adjacent side surfaces of four side surfaces of the multilayer body intersect;
   a portion of the second outer electrode is in contact with one of the two adjacent side surfaces; and
   a maximum width of the portion of the second outer electrode in a direction parallel or substantially parallel to the one of the two adjacent side surfaces is smaller than a maximum width of the first outer electrode in a direction parallel or substantially parallel to the mounting surface.

2. The circuit element according to claim 1, wherein the first outer electrode is in contact with the mounting surface and the side edge.

3. The circuit element according to claim 1, wherein
   the second outer electrode is in contact with each of the two adjacent side surfaces;
   the two adjacent side surfaces of the multilayer body include a first side surface with a larger area and a second side surface having a smaller area than the first side surface; and
   a width of the second outer electrode on the first side surface in a direction parallel or substantially parallel to the mounting surface is larger than a width of the second outer electrode on the second side surface in a direction parallel or substantially parallel to the mounting surface.

4. The circuit element according to claim 1, wherein the at least one internal element includes a capacitor electrode connected to the second outer electrode.

5. The circuit element according to claim 4, wherein an LC filter circuit includes an inductor including the coil conductor and a capacitor including the capacitor electrode.

6. The circuit element according to claim 1, further comprising:
   a third outer electrode connected to neither the first outer electrode nor to the second outer electrode; wherein
   the third outer electrode is in contact with the mounting surface and in contact with the side edge together with the second outer electrode.

7. The circuit element according to claim 1, wherein the first outer electrode and the second outer electrode define an L shape on a side surface of the multilayer body, and a lower portion of the L shape is shorter than a side portion of the L shape in a laminating direction of the multilayer body, the lower portion being in contact with the mounting surface and the side portion being in contact with the side edge.

8. The circuit element according to claim 1, further comprising a via-hole conductor connecting a first end of the coil and a second end of the coil conductor.

9. The circuit element according to claim 1, further comprising a second coil conductor.

10. The circuit element according to claim 9, further comprising a via-hole conductor connecting a first end of the second coil conductor and a first end of the second coil conductor.

11. The circuit element according to claim 8, wherein the coil conductor and the via-hole conductor define a first coil.

12. The circuit element according to claim 10, wherein the second coil conductor and the via-hole conductor define a second coil.

13. A circuit element comprising:
   a multilayer body having a rectangular or substantially rectangular parallelepiped shape and including laminated base material layers;
   at least one internal element inside the multilayer body;
   a first outer electrode and a second outer electrode on outer surfaces of the multilayer body; and
   a third outer electrode connected to neither the first outer electrode nor to the second outer electrode; wherein the at least one internal element includes a coil conductor connected to the second outer electrode;
the coil conductor includes a winding axis extending in a laminating direction of the base material layers;
the first outer electrode is in contact with a mounting surface, the mounting surface being a bottom surface of the multilayer body in the laminating direction;
the second outer electrode is in contact with a side edge and separated from the mounting surface, the side edge being where two adjacent side surfaces of four side surfaces of the multilayer body intersect;
a maximum width of the second outer electrode is smaller than a maximum width of the first outer electrode in a direction parallel or substantially parallel to the mounting surface; and
the third outer electrode is in contact with the mounting surface and in contact with the side edge together with the second outer electrode.

\* \* \* \* \*